US008370790B2

(12) United States Patent
Sheng (10) Patent No.: US 8,370,790 B2
(45) Date of Patent: Feb. 5, 2013

(54) COMPUTER AIDED DESIGN SYSTEM FOR CHECKING DIMENSIONS OF PATTERNS AND METHOD (75) Inventor: Xiao-Cheng Sheng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 68 days.

(21) Appl. No.: 13/101,168

(22) Filed: May 5, 2011

(65) Prior Publication Data

US 2012/0042297 A1  Feb. 16, 2012

(30) Foreign Application Priority Data

Aug. 16, 2010  (CN) .......................... 2010 1 0254233

(51) Int. Cl.
G06F 17/50 (2006.01)
(52) U.S. Cl. .................. 716/137; 716/126; 716/130
(58) Field of Classification Search .................. 716/137, 716/139, 126, 130
See application file for complete search history.

(56) References Cited

U.S. PATENT DOCUMENTS

| | | | |
|---|---|---|---|
| 6,192,509 B1* | 2/2001 | Akkiraju ........................ 716/126 |
| 6,606,731 B1* | 8/2003 | Baum et al. .................... 716/103 |
| 6,678,874 B1* | 1/2004 | Jochym et al. ................. 716/112 |
| 7,168,041 B1* | 1/2007 | Durrill et al. .................. 715/700 |
| 7,219,318 B2* | 5/2007 | Wu et al. ........................ 716/112 |
| 7,257,794 B2* | 8/2007 | Tang et al. ..................... 716/122 |
| 7,284,216 B2* | 10/2007 | Tsai et al. ...................... 716/112 |
| 7,325,215 B2* | 1/2008 | Dinter et al. ................... 716/114 |
| 7,661,078 B1* | 2/2010 | Noice et al. ................... 716/136 |
| 7,865,857 B1* | 1/2011 | Chopra et al. ................. 716/119 |
| 8,161,451 B2* | 4/2012 | Woods .......................... 716/137 |
| 8,214,789 B2* | 7/2012 | Boose ........................... 716/139 |
| 8,255,864 B2* | 8/2012 | Ye et al. ......................... 716/137 |
| 2002/0083398 A1* | 6/2002 | Takeyama et al. ............... 716/1 |
| 2004/0225988 A1* | 11/2004 | Petunin et al. ................. 716/11 |
| 2005/0229129 A1* | 10/2005 | Tsai et al. ......................... 716/6 |
| 2006/0101368 A1* | 5/2006 | Kesarwani et al. ............ 716/11 |
| 2006/0136857 A1* | 6/2006 | Felton ............................ 716/15 |
| 2006/0218516 A1* | 9/2006 | McLain et al. ................. 716/10 |
| 2007/0118823 A1* | 5/2007 | Zhao et al. ....................... 716/5 |
| 2007/0150848 A1* | 6/2007 | Liu ................................ 716/15 |
| 2007/0288877 A1* | 12/2007 | Matsuoka ....................... 716/11 |
| 2008/0022251 A1* | 1/2008 | McConaghy et al. .......... 716/11 |
| 2008/0077903 A1* | 3/2008 | Dinter et al. ................... 716/11 |
| 2008/0109773 A1* | 5/2008 | Douriet ............................ 716/5 |
| 2009/0125861 A1* | 5/2009 | Orita et al. ..................... 716/15 |
| 2009/0327981 A1* | 12/2009 | Nakamura et al. .............. 716/4 |
| 2010/0229141 A1* | 9/2010 | Dinter et al. ..................... 716/9 |
| 2010/0275172 A1* | 10/2010 | Yaguchi .......................... 716/6 |
| 2010/0287520 A1* | 11/2010 | Nitta ............................... 716/14 |
| 2011/0113394 A1* | 5/2011 | Woods .......................... 716/106 |
| 2012/0180020 A1* | 7/2012 | Woods .......................... 716/137 |

* cited by examiner

Primary Examiner — Stacy Whitmore
(74) Attorney, Agent, or Firm — Altis Law Group, Inc.

(57) ABSTRACT

A computer aided design system comprises an interface creating module, a selecting module, a filling module and a measuring module. The interface module creates a user interface to display the design on the screen of the device with a plurality of to-be-checked patterns. The selecting module selects a pattern. The interface module further creates a parameter setting interface. The parameters comprises a predetermined width, the space value between the adjacent parallel filled lines and the rotation degree of the selected pattern. The filling module draws filled lines in the selected pattern according to the parameters. The measuring module detects whether the length of each filled line is at least the predetermined width value, if the length of the filled line is less than the predetermined width value, the dimension of the selected pattern is unqualified and the measuring module highlights the filled lines.

20 Claims, 7 Drawing Sheets

COMPUTER AIDED DESIGN SYSTEM FOR CHECKING DIMENSIONS OF PATTERNS AND METHOD

BACKGROUND

1. Technical Field

The present disclosure relates to printed circuit board layout systems, particularly, to checking dimensions of copper patterns designed on the board.

2. Description of Related Art

Figure 7:
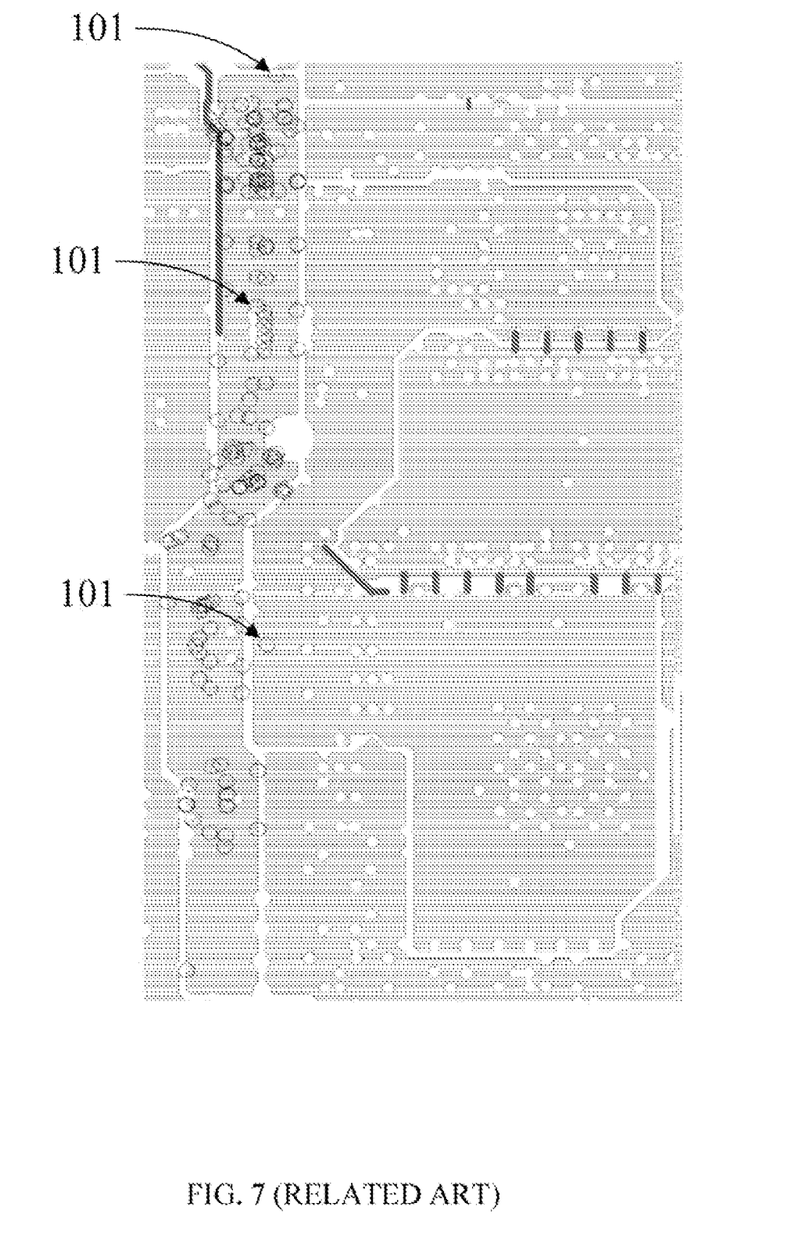
FIG. 7 is a schematic diagram of a marked cooper pattern of the computer aided design system in a related art.

When designing layouts for electronic parts such as a printed circuit board (PCB) using software, the software should be able to determine and indicate the faulty area of the dimensions of various parts such as the patterns made for copper traces designed in a PCB layout diagram. As shown in FIG. 7, some software may mark areas of a design with circles 101 to indicate places in the design that do not meet predetermined values. However, this system only generally indicates a faulty area and does not clearly indicate orientation of the faults, which makes it difficult to identify and correct the problems in the design.

Therefore, there is room for improvement in the art.

BRIEF DESCRIPTION OF THE FIGURE

Many aspects of the embodiments can be better understood with reference to the following drawings. The components in the drawings are not necessarily drawn to scale, the emphasis instead being placed upon clearly illustrating the principles of the PCB layout system and method thereof. Moreover, in the drawings, like reference numerals designate corresponding parts throughout the several views.

DETAILED DESCRIPTION

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage system. Embodiments of the present disclosure will now be described in detail with reference to the drawings.

Figure 1:
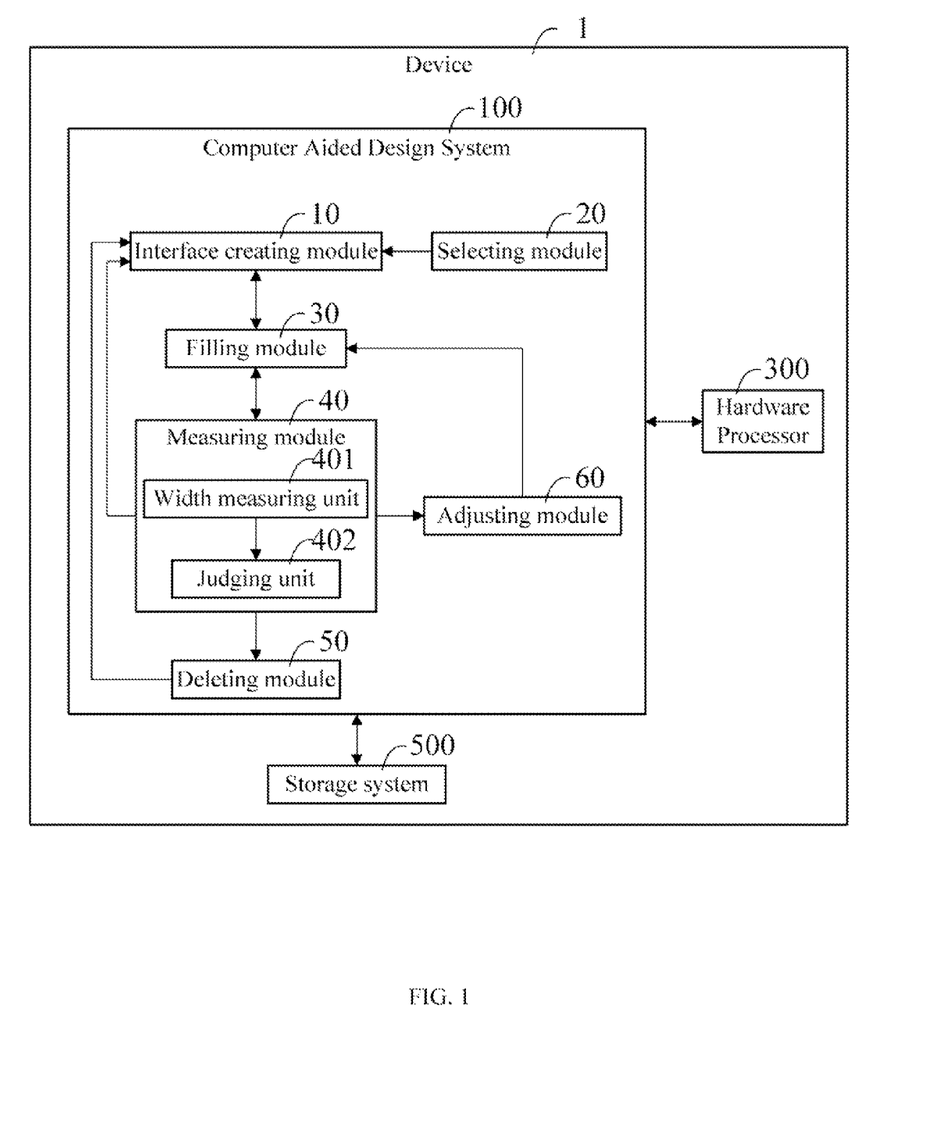
FIG. 1 is a block diagram of a computer aided design system in accordance with an embodiment.
Figure 2:
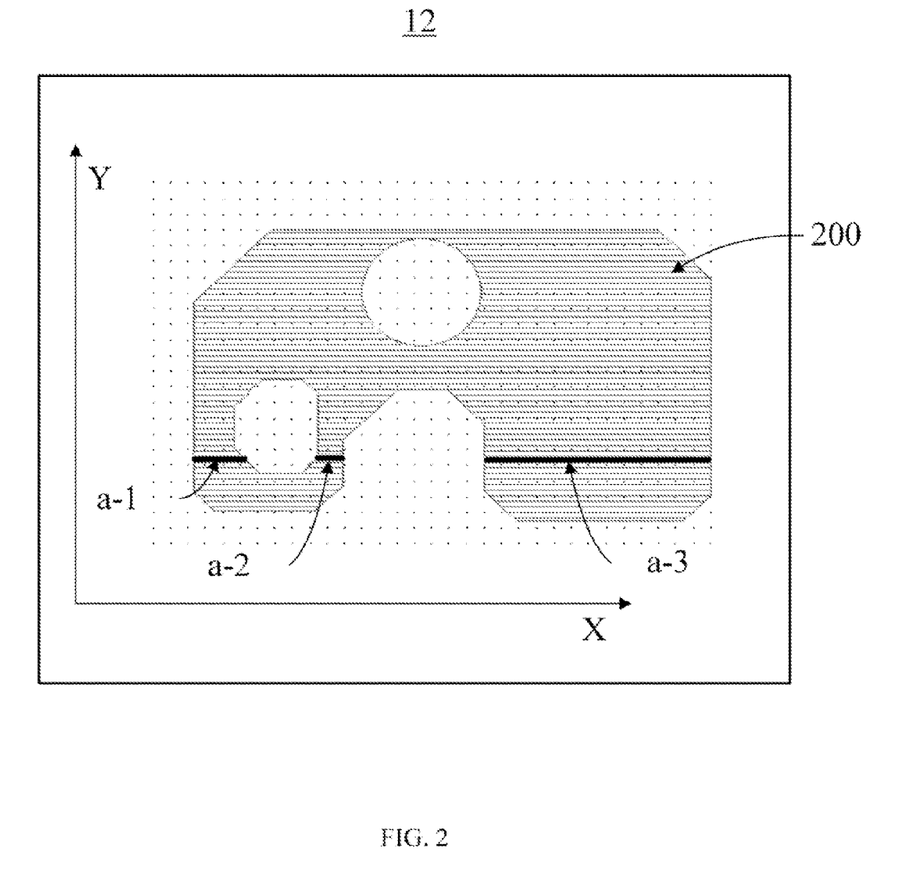
FIG. 2 is a schematic diagram of a pattern displayed on the screen of a computer aided design system of FIG. 1.

Referring to FIGS. 1-2, a device 1 such as a computer comprises a computer aided design system 100, a hardware processor 300 and a storage system 500. The computer aided design system 100 includes an interface creating module 10, a selecting module 20, a filling module 30, a measuring module 40, a deleting module 50, and an adjusting module 60. In the embodiment, the computer aided design system 100 is used in a PCB layout system to measure patterns of PCB layouts to check for discrepancies from what is required of a PCB design. In this embodiment measuring is done only along a horizontal orientation. So when checking a PCB design on a screen of the device 1, it can be reoriented as many times as needed so that all dimensions of patterns can be horizontally oriented and checked. The modules 20-60 may comprise computerized code in the form of one or more programs that are stored in the storage system 500. The computerized code includes instructions that are executed by the at least one hardware processor 300 to provide functions for modules 20-60.

The hardware processor 300 executes one or more computerized code of the device 1 and other applications, to provide the functions of the device 1.

The storage system 500 may be a memory system of the device 1, and also may be an external storage card, such as a smart media (SM) card, or secure digital (SD) card, for example.

The interface creating module 10 is used for providing a user interface 12 on the screen of the device and displaying a design with a plurality of to-be-checked patterns. In some embodiments, the design may be of a PCB layout. The user interface 12 comprises a grid with Cartesian rectangular coordinates or XY axes for specifically identifying locations of the filled lines in the design.

The selecting module 20 is used for selecting a to-be-checked pattern 200 according to user operations.

Figure 3:
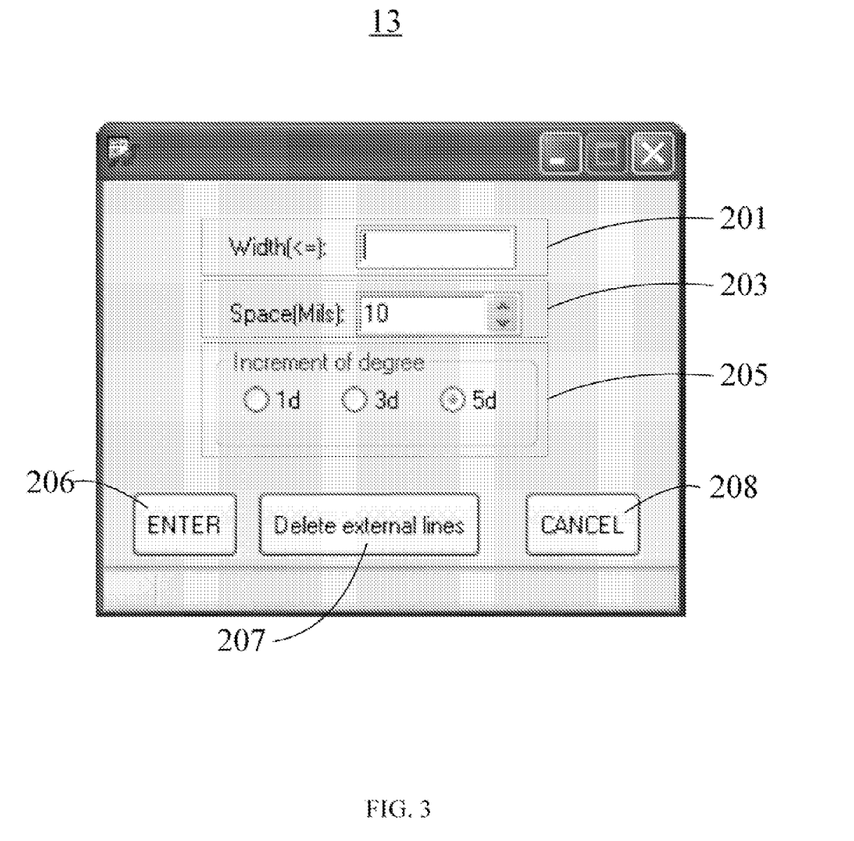
FIG. 3 is a schematic diagram showing a parameter setting window displayed on the computer aided design system of FIG. 1.

As shown in FIG. 3, the interface creating module 10 provides a parameter setting interface 13, through which the user can set the parameters used for drawing to-be-filled lines, as the to-be-checked pattern 200 is selected. In the embodiment, the parameter setting interface 13 is displayed in the user interface 12. The parameter setting interface 13 includes a width input field 201, a space list box 203, a rotation degree checkbox 205 including three radio buttons, an enter button 206, a delete external lines button 207, and a cancel button 208. The width input filed 201 is used for inputting a predetermined width value. The predetermined width value may be a minimal width value of a selected portion of the selected pattern according to an amount of current that would flowing therethrough. The space list box 203 is used for inputting a number of spaces between every two adjacent to-be-filled parallel lines. The rotation checkbox 205 is used for selecting different degree of rotation of the selected pattern. In the embodiment, each radio buttons of the rotation checkbox 205 respectively corresponds to a different degree of rotation, such as 30 degrees, 45 degrees, and 90 degree. When the enter button 206 is clicked, a filling signal is generated and parameters are transmitted to the filling module 30. When the delete external lines button 207 is clicked, a deleting signal is generated and transmitted to the deleting module 50. When the cancel button 208 is clicked, the parameter setting interface 13 is exited.

The filling module 30 is used for drawing filled lines in the selected pattern according to the parameters, and then generating a measuring signal. In the embodiment, the filled lines are parallel to the X axis. In other embodiment, the filled lines may comprises a first group of filled lines parallel to the X axis and a second group of filled lines parallel to the Y axis.

The measuring module 40 is used for measuring whether the length of each filled line is less than the predetermined width value in response to the measuring signal. The measuring module 40 comprises a width measuring unit 401 and a judging unit 402.

The width measuring unit 401 measures the length of each filled line to determine all the dimension of the selected pattern and then sends the results to the judging unit 402. In some embodiments, the selected pattern of the PCB layout diagram may include a plurality of holes which break some filled lines into a plurality of broken parts. The width measuring unit 401 considers sum lengths of all the broken parts as the length of a single filled line.

As shown in FIG. 2, when the width measuring unit 401 calculates the length of each filled lines, the width measuring unit 401 divides all of the filled lines into different groups by the vertical coordinates. The width measuring unit 401 can determine if a filled line has been broken into parts by holes in the selected pattern according to horizontal alignment of the parts. In other words, what appears to be three lines would be treated as one filled line if the three filled lines are horizontally aligned and separated only by holes in the selected pattern. Filled lines separated by other than holes, cutouts for example, are treated as different filled lines even if horizontally aligned.

Referring to FIG. 2 again to explain the treatment of a broken filled line, when the width measuring unit 401 finds the filled lines, the filled lines a-1, a-2 and a-3 are horizontally aligned, but a-1 and a-2 are separated by a hole, and a-2 and a-3 are separated by a cutout, a-1 and a-2 are considered part of the same filled line and a-3 is a different filled line. The width calculation unit 401 adds the lengths of the filled lines a-1 and a-2 to determine the length of that particular filled line. The width calculation unit 401 measures the length of the filled line a-3 separately.

Figure 4:
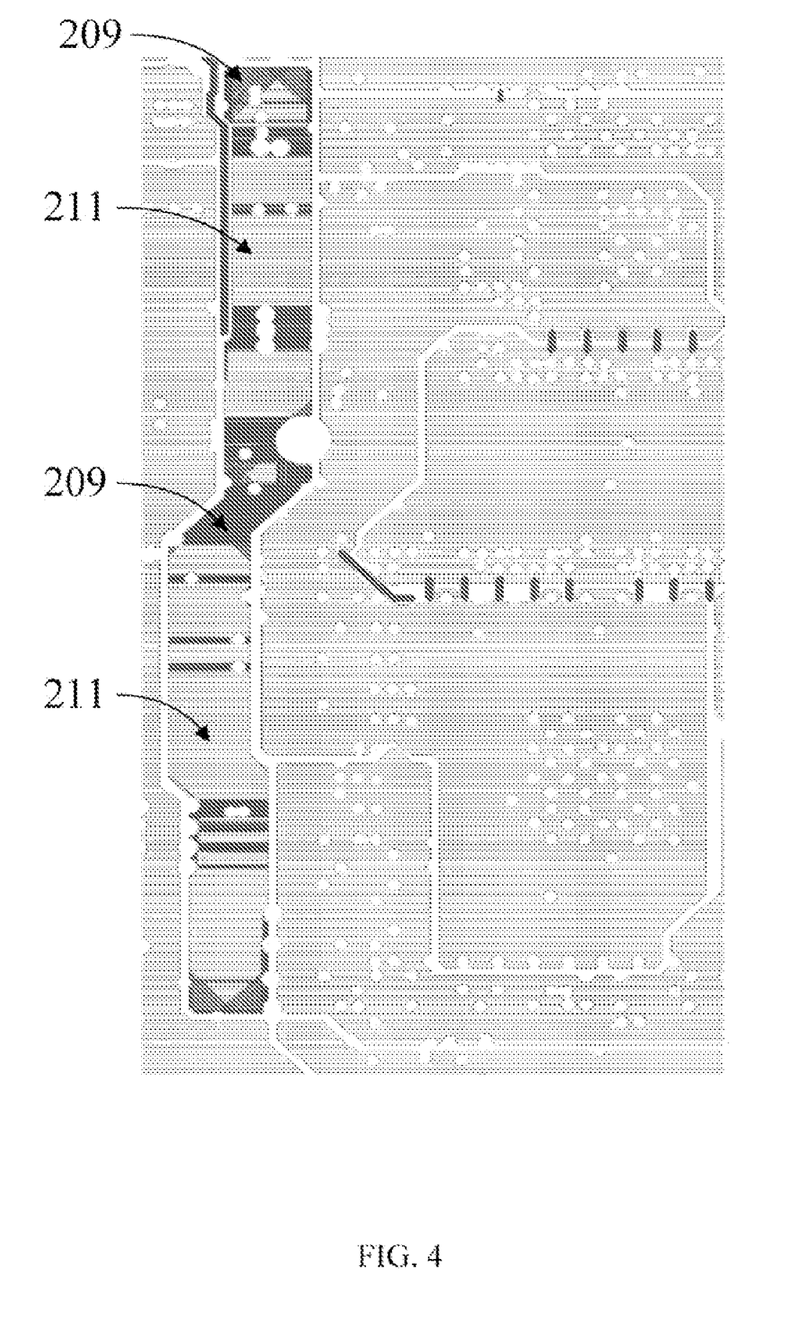
FIG. 4 is a schematic diagram of a marked pattern of a computer aided design system of FIG. 1.

Referring to FIG. 1 again, the judging unit 402 is used for judging whether the length of a filled line is less than the predetermined width value. If the length of the filled line is less than the predetermined width value, the dimension of that horizontal portion of the selected pattern is in error and a designer can quickly discover what needs to be corrected in the selected pattern, and the judging unit 402 highlights the filled lines, that are too short, in the selected pattern. Referring also to FIG. 4, in some embodiments, the filled lines 209 are too short and highlighted in black, while the filled lines in regions 211 are qualified.

The adjust module 60 is used by a designer to adjust the dimension of the regions covered by the highlight filled lines.

The deleting module 50 is used for deleting the filled lines in response to the deleting signal.

Figure 5:
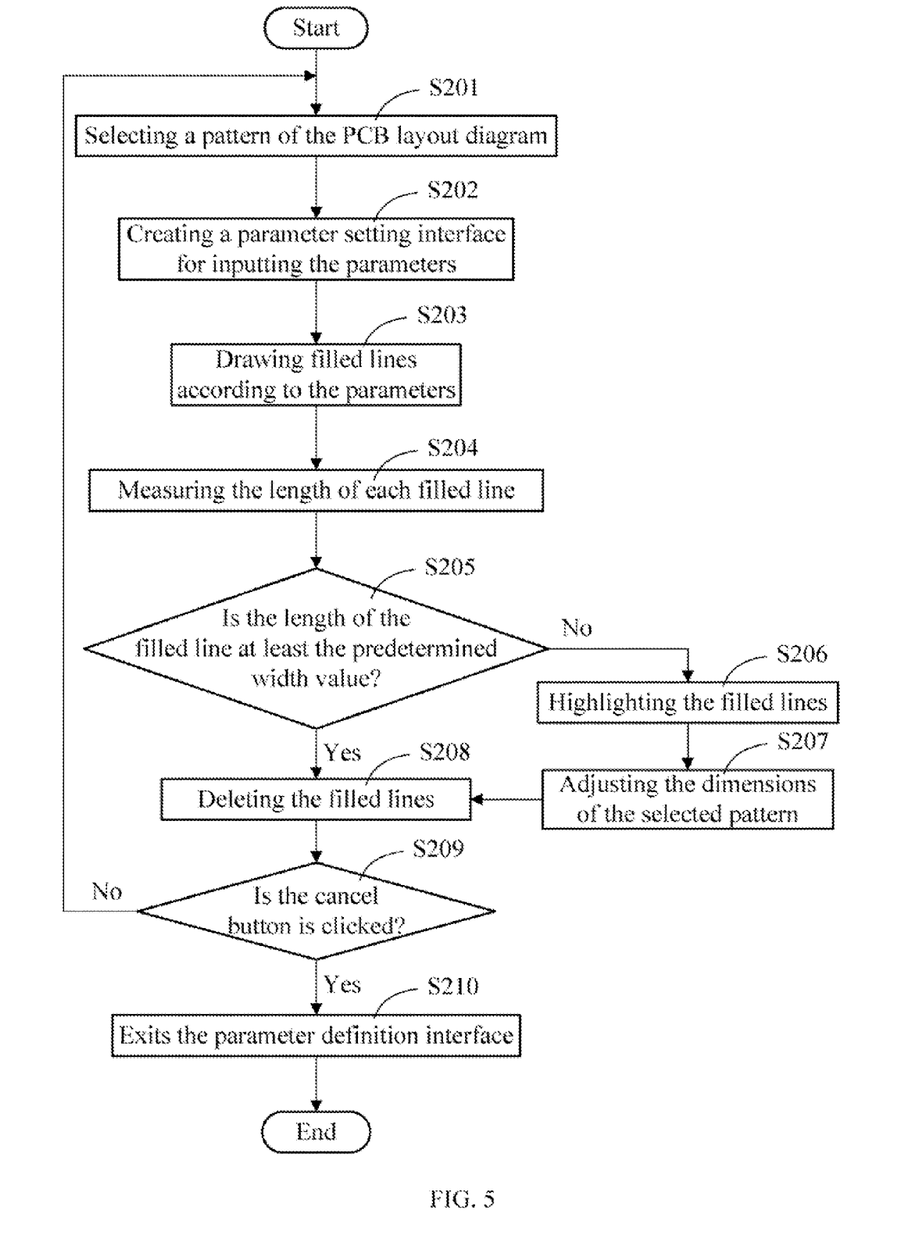
FIG. 5 is a flowchart of a checking method in accordance with the embodiment.

Referring to FIG. 5, a checking method is used for checking the dimension of the patterns in the PCB layouts of the computer aided design system in the device. The checking method includes the following steps.

In step S201, the selecting module selects a to-be-checked pattern of the design on the screen of the device.

In step S202, the interface creating module creates a parameter setting interface for inputting the parameters. In the embodiment, the parameters include a predetermined width, a space and a rotation degree. The predetermined width is a minimal width value of the selected pattern according to an amount of current that would be flowing therethrough. The space is the space between every two adjacent parallel to-be-filled lines. The rotation degree is the rotation degree of the selected pattern. In the embodiment, the parameter setting interface further comprises an enter button. When the enter button is clicked, the parameter setting interface generates a filling signal.

In step S203, the filling module draws filled lines in the selected pattern according to the parameters in response to the filling signal. In the embodiment, the filled lines are parallel with the X axis. In other embodiment, the filled lines may comprises a first group of filled lines parallel to the X axis and a second group of filled lines parallel to the Y axis.

In step S204, the width measuring unit measures the length of each filled line.

In step S205, the judging unit judges whether the length of each filled line is at least a predetermined width value, if the length of the filled lines is less than the predetermined width value, the dimension of that horizontal portion of the selected pattern is in error and the step S206 is implemented, if the length of each filled line is at least the predetermined width value, the dimension of that horizontal portion of the selected pattern is qualified and the step S208 is implemented.

In step S206, the judging unit highlights the filled lines on the selected pattern which are too short. In the embodiment, the highlight filled lines are highlighted in black.

In step S207, the adjusting module adjusts the dimension of the selected pattern according to the highlight filled lines and step S208 is implemented.

In step S208, the deleting module deletes the filled lines in response to the deleting signal. In the embodiment, the parameter setting interface further comprises a delete external lines button. When the delete external lines button is clicked, the parameter setting interface generates a deleting signal.

In step S209, the interface creating module detects whether the cancel button is clicked. In the embodiment, the parameter setting interface further comprises a cancel button. If the cancel button is clicked, the step S210 is implemented, if the cancel button is not clicked, return to the step S201.

In step S210, the interface creating module exits the parameter setting interface.

Figure 6:
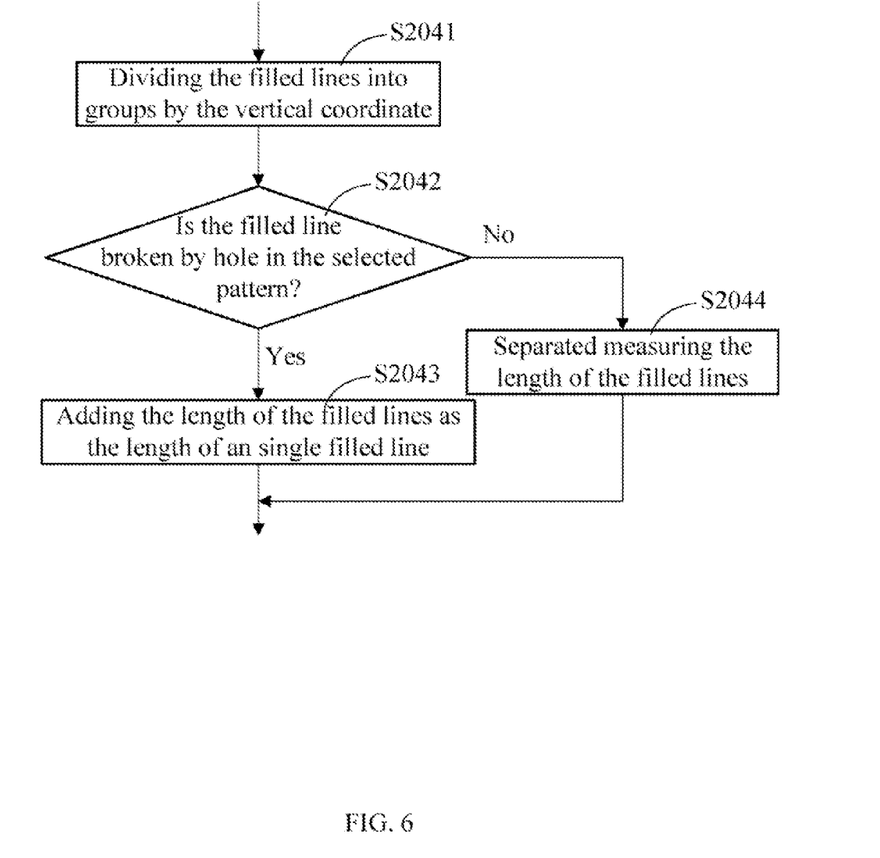
FIG. 6 is a flowchart detailing a step of a calculating the length of each filled line from the method of FIG. 5 in accordance with the embodiment.

In the embodiment, the selected pattern of the PCB layout diagram may includes a plurality of holes which break one filled line into a plurality of broken parts. The width measuring unit 401 considers sum of length of broken parts the length of a single filled line. As FIG. 6 shows, the step S204 further comprise the following steps.

In step S2041, the width measuring unit divides the filled lines into different groups by the vertical coordinate.

In step S2042, the width measuring unit determines whether a filled line has been broken into parts by holes in the selected pattern according to horizontal alignment of the parts, if the filled line has been broken into parts by holes, the step S2043 implemented, if the filled line has been broken into parts by cutout, the step S2044 is implemented.

In step S2043, the measuring unit adds the length of the adjacent filled lines as the length of a filled line.

In step S2044, the measuring unit separated measures the length of the adjacent filled lines.

In use, when a designer design measures the dimensions of the pattern in the design, the faulty area of the pattern are definitely marked by the highlight filled lines.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A computer aided design system of a device used in the printed circuit board layout system for checking dimensions of patterns, the device comprises at least one hardware processor and a storage system; the computer aided design system comprises one or more programs, the one or more programs stored in the storage system, executable by the at least one processor, the one or more programs comprising:

an interface creating module adapted to create a user interface on a screen of the device to display a design with a plurality of patterns;

a selecting module adapted to select one of the patterns;

a filling module adapted to draw a plurality of filled lines in the selected pattern; and a measuring module adapted to measure whether the length of each of the plurality of the filled lines is at least a predetermined width value, if the length of one of the filled lines is less than the predetermined width value, the dimension of the selected pattern covered by the filled line the length of which is less than the predetermined width value is unqualified, the measuring module also adapted to highlight the filled lines which is less than the predetermined width value.

2. The computer aided design system of claim 1, wherein the interface creating module further creates a parameter setting interface, the parameter setting interface is used for inputting parameters, and the filling module draws the filled lines according to the parameters. the parameter setting interface comprises a width input field, a space list box and a rotation degree checkbox, the width input field is used for inputting the predetermined width value, the space list box is used for inputting a number of space between the adjacent parallel to-be-filled lines, and the rotation degree checkbox is used for selecting a rotation degree of the selected pattern.

3. The computer aided design system of claim 2, wherein the parameter setting interface further comprises a cancel button, the designer presses the cancel button to exit the parameter setting interface.

4. The computer aided design system of claim 2, wherein the measuring system further comprises a deleting module, the parameter setting interface further comprises a delete external lines button, when the delete external lines button is clicked, the parameter setting interface generates a deleting signal, the deleting module deleting the filled lines in response to the deleting signal.

5. The computer aided design system of claim 1, wherein the measuring module comprises a width measuring unit and a judging unit, the width measuring unit is used for measuring the length of the filled lines, the judging unit is used for judging whether the length of each filled line is at least the predetermined width value.

6. The computer aided design system of claim 5, wherein the user interface comprises a grid and XY axes for identifying locations of the filled lines.

7. The computer aided design system of claim 6, wherein the width measuring unit divides the filled lines into different groups by the vertical coordinate and judges whether the filled line has been broken into parts by holes in the selected pattern according to horizontal alignment of the parts, if the filled line has been broken into parts by holes, the width measuring unit adds the length of the filled lines as a single filled line.

8. The computer aided design system of claim 7, wherein if the filled line has been broken into parts by cutout, the width measuring unit respectively measures the length of the filled lines.

9. The computer aided design system of claim 8, wherein the measuring system further comprises an adjusting module, if the length of the filled line is less than the predetermined width value, the measuring module highlights the filled lines which is too short in the selected pattern, the adjusting module adjusts the dimension of the selected pattern according to the highlighted filled lines.

10. A checking method for the computer aided design system of a device in the printed circuit board layout, the computer aided design system capable of executed by a hardware processor to perform instructions stored in a storage system, the device comprising one or more social network applications and a contact list, wherein the computer aided design system comprises an interface creating module and a filling module; the checking method comprising:

the interface creating module creates a user interface on the screen of the device and display a design with a plurality of patterns;

selecting a pattern of the design;

the filling module draws a plurality of filled lines in the selected pattern;

measuring whether the length of each of the plurality of the filled lines is at least a predetermined width value respectively, if the length of one of the filled lines is less than the predetermined width value, the dimension of the selected pattern covered by the filled line the length of which is less than the predetermined width value is unqualified; and highlighting the filled lines the length of which is less than the predetermined width value.

11. The method according to claim 10, wherein the interface further creates a parameter setting interface, the parameter setting interface is used for inputting parameters, the filling module draws the filled lines according to the parameters.

12. The method according to claim 11, wherein the parameter setting interface comprises a width input filed, a space list box and a rotation degree checkbox, the width input filed is used for inputting the predetermined width value, the space list box is used for inputting a number of space between every two adjacent parallel to-be-filled lines, and the rotation degree checkbox is used for selecting different rotation degrees of the selected pattern.

13. The method according to claim 11, wherein the parameter setting interface further comprises a cancel button, if the cancel button is clicked, and the computer aided design system exits the parameter setting interface.

14. The method according to claim 11, wherein the user interface comprises a grid and XY axes for specifically identifying locations of the filled lines; the step of measuring the length of the filled lines is at least a predetermined width value further comprising:

dividing the filled lines into groups by the vertical coordinate;

judging whether the filled line has been broken into parts by holes in the selected pattern according to horizontal alignment of the parts, if the filled line has been broken into parts by holes, the filled lines are consider as a single filled line; and adding the length of the filled lines as the length of a single filled line.

15. The method according to claim 14, wherein if filled line has been broken into parts by cutout, the filled lines are consider as different filled lines; and respectively measuring the length of the filled lines.

16. The method according to claim 14, further comprising steps of highlighting the filled lines the length of which is less than the predetermined width value, adjusting the width of the highlighted filled lines according to an operation of users.

17. The method according to claim 16, wherein the parameter setting interface further comprises a delete external lines button, if the delete external lines button is clicked, the parameter setting interface generates a deleting signal.

18. The method according to claim 17, further comprising steps of adjusting the width of the filled lines according to the operation of users, deleting the filled lines in the selected pattern.

19. A computer aided design system of a device used in the printed circuit board layout system for checking dimensions of patterns, the device comprises at least one hardware processor and a storage system; the computer aided design system comprises one or more programs, the one or more programs stored in the storage system, executable by the at least one processor, the one or more programs comprising:

an interface creating module adapted to create a user interface on a screen of the device to display a design with a plurality of patterns;

a selecting module adapted to select one of the patterns;

a filling module adapted to draw a plurality of filled lines in the selected pattern; and a measuring module adapted to measure the length of each of the plurality of the filled lines and indicating the filled lines the length of which are less than a predetermined width value wherein the user interface comprises a grid and XY axes for identifying locations of the filled lines; the measuring module comprises a width measuring unit and a judging unit, the width measuring unit divides the filled lines into different groups by the vertical coordinate and judges whether the filled line has been broken into parts by holes in the selected pattern according to horizontal alignment of the parts, if the filled line has been broken into parts by holes, the width measuring unit adds the length of the filled lines as a single filled line; the judging unit judges whether the length of each filled line is at least the predetermined width value and highlights the filled lines which is less than the predetermined width value for indicating the unqualified position of the selected pattern covered by the highlighted filled line.

20. The computer aided design system of claim 19, wherein the interface creating module further creates a parameter setting interface, the parameter setting interface is used for inputting parameters, and the filling module draws the filled lines according to the parameters; the parameter setting interface comprises a width input field, a space list box, and a rotation degree checkbox, the width input field is used for inputting the predetermined width value, the space list box is used for inputting a number of space between the adjacent parallel to-be-filled lines, and the rotation degree checkbox is used for selecting a rotation degree of the selected pattern.

* * * * *